United States Patent [19]

Huynh-Tran

[11] Patent Number: 5,290,663
[45] Date of Patent: Mar. 1, 1994

[54] PHOTOCURABLE POLYURETHANE-ACRYLATE IONOMER COMPOSITIONS FOR AQUEOUS DEVELOPABLE PRINTING PLATES

[75] Inventor: Truc-Chi T. Huynh-Tran, Burtonsville, Md.

[73] Assignee: W. R. Grace & Co.-Conn., New York, N.Y.

[21] Appl. No.: 662,699

[22] Filed: Mar. 1, 1991

[51] Int. Cl.$^5$ .......................... G03C 1/73; G03F 7/027; C08G 18/34

[52] U.S. Cl. ...................................... 430/284; 522/96; 522/97; 522/149; 522/90; 430/913; 430/927

[58] Field of Search ............... 522/96, 97, 90, 149; 528/76; 525/460; 430/284, 913, 927

[56] References Cited

U.S. PATENT DOCUMENTS

| | | | |
|---|---|---|---|
| 2,760,863 | 8/1956 | Plambeck, Jr. | 430/306 |
| 3,891,523 | 6/1975 | Hisamatsu et al. | 522/97 |
| 3,932,356 | 1/1976 | Takagi | 522/90 |
| 4,023,973 | 4/1975 | Imaizumi et al. | 430/286 |
| 4,460,738 | 7/1984 | Frentzel et al. | 524/591 |
| 4,528,334 | 7/1985 | Knopf et al. | 525/404 |
| 4,590,255 | 5/1986 | O'Connor | 528/71 |
| 4,607,084 | 8/1986 | Morris | 522/90 |
| 4,762,892 | 8/1988 | Koch et al. | 525/279 |
| 4,877,711 | 10/1989 | Aoai et al. | 522/97 |
| 4,950,582 | 8/1990 | Aoai et al. | 430/175 |
| 5,089,376 | 2/1992 | Setthachayanon | 522/97 |
| 5,093,386 | 3/1992 | Bishop et al. | 522/97 |

FOREIGN PATENT DOCUMENTS

| | | |
|---|---|---|
| 261910 | 3/1988 | European Pat. Off. |
| 351628 | 1/1990 | European Pat. Off. |
| 3841025 | 7/1990 | Fed. Rep. of Germany |
| 2-4255 | 1/1990 | Japan |
| 2-46460 | 2/1990 | Japan |
| 2-77748 | 3/1990 | Japan |

OTHER PUBLICATIONS

R. C. Hire and S. C. Cohen, "Carboxyl Modified Polyols in Urethane Applications", Proceedings of the SPI-32nd Annual Conference, pp. 118-125, Oct. 1-8, 1989.

R. C. Hire, "Carboxyl Modified Polyols in Water-Borne Urethane Coatings" Symposium, pp. 357-358, Feb. 1-3, 1989 (New Orleans).

N. Barksby and R. M. Gerkin, "Acid Grafted Polyether: Reactive Intermediates for Use in Low VOC Coatings Application", 17th Annual Water-Borne and Higher-Solids Coatings Symposium, Feb. 21-23, 1990.

"Ucarmod", Technical Brochure, Union Carbide Corp. (1990).

*Primary Examiner*—Susan Berman
*Attorney, Agent, or Firm*—Valerie E. Looper

[57] ABSTRACT

A photopolymer useful in preparing water-developable, solid printing plates is prepared by (A) preparing a urethane prepolymer by reacting a polyoxyalkylene diol (optionally carboxylic acid grafted) with an excess of diisocyanate, followed by chain extending the resulting prepolymer mixture with a dialkylolpropionic acid and preferably with additional diols(s) such as alkane diol(s) and (meth)acrylate-containing diol(s). Use of a new (meth)acrylate-containing diol in such chain extension completes the formation of photopolymer. However, in a third operation (B) hydroxyalkylmethacrylate may be reacted with the result of (A) whether or not (meth)acrylate-containing diol is used in (A). The carboxylic acid groups of the photopolymer may also be partially neutralized with a base. The photopolymer is suitably formulated with additional photoactive (meth)acrylate monomers or oligomers and photoinitiator for casting on a substrate or extruding to form a flexographic printing plate. Following UV exposure of the plate through a negative, unexposed areas can be removed by washing with an aqueous alkaline solution to give a plate with a desirable relief image. The use of the aqueous alkaline washout solution as opposed to organic solvents minimizes pollution problems.

13 Claims, No Drawings

PHOTOCURABLE POLYURETHANE-ACRYLATE IONOMER COMPOSITIONS FOR AQUEOUS DEVELOPABLE PRINTING PLATES

RELATED APPLICATIONS

U.S. Ser. No. 561,849, filed Aug. 1, 1990, now abandoned, S. K. Mirle and A. L. Berrier, and U.S. Ser. No. 514,899 filed Apr. 26, 1990, now abandoned, A. L. Berrier and R. L. Kumpfmiller, owned by the same assignee hereof, are directed to aqueous developable photocurable compositions

FIELD OF THE INVENTION

This invention relates to radiation curable prepolymers and formulations or compositions containing the same, as well as photosensitive articles having solid surfaces or layers prepared from such prepolymers or formulations. The invention also relates to a process for making and using the prepolymer or composition to form the photosensitive articles.

BACKGROUND OF THE INVENTION

Photocurable prepolymers and compositions are well known in the art for forming printing plates and other photosensitive or radiation sensitive articles. In the field of radiation sensitive flexographic printing plates, the plates typically comprise a support and a photosensitive surface or layer from a photocurable composition. Additional layers or surfaces on the plate include slip and release films to protect the photosensitive surface. Prior to processing the plate, the additional layers are removed, and the photosensitive surface is exposed to radiation in an imagewise fashion. The unexposed areas of the surface are then removed in developer baths.

Removal of unexposed surfaces comprising solid photocurable compositions such as those disclosed in U.S. Pat. No. 2,760,863 require the use of developer baths comprising environmentally unsafe, organic solvents such as tetrachloroethylene, 2-butanone, benzene, toluene, xylene, trichloroethane and solvent mixtures such as tetrachloroethylene/n-butanol However, due to the toxicity, high volatility and low flash point, their use gives rise to hazardous conditions and creates pollution problems. Thus, recently there has been a strong interest in the field to develop photosensitive layers in non-organic solvent developing solutions, e.g. aqueous, surfactant-aqueous or alkaline-aqueous solutions. However, the compositions resulting from recent attempts to achieve aqueous developable plates demonstrate deficiencies in mechanical properties, e.g. flexibility. See European Application 261,910.

For instance, in addition to possessing an aqueous developable photosensitive surface, a flexographic printing plate must have sufficient flexibility to wrap around a printing cylinder, yet be strong enough to withstand the rigors experienced during typical printing processes. Further, the printing plate should possess a low hardness or softness to facilitate ink transfer during printing.

Previous aqueous developable compositions have not possessed all the desirable features such as flexibility, softness and solvent resistance to inks typically used in printing. For example, U.S. Pat. No. 4,023,973 describes a photosensitive composition comprising a maleic anhydride adduct of a 1,2-polybutadiene. However, because the 1,2 content of this material is very high, i.e. 70% or more, this composition has an undesirably high rubber hardness.

Furthermore, other water-developable photosensitive compositions which contain as the main component a high molecular weight polymer such as polyvinyl alcohol, cellulose, polyethylene oxide, or the like, are insufficient in flexibility and possess a high degree of rubber hardness and hence are unsuitable for use in flexographic printing plates.

Finally, it is also important that the photosensitive surface of the printing plate be dimensionally stable during storage. For example, some compositions used for making plates have shown inferior stability properties when used in solid flexographic printing plates in that the compositions become tacky and pasty during storage. Those inferior properties have been attributed to the low molecular weight of the polymers used to prepare the printing plates. See U.S. Pat. No. 4,762,892 to Koch et al. and discussion of low molecular weight polymers disclosed in Japanese Kokoku 57-23693.

Carboxyl-modified urethane prepolymers are known, and the aqueous dispersibility of several has been studied. One type of aqueous dispersible composition known in the art is a carboxylated urethane. The following disclose representative examples. A paper by R. C. Hire and S. C. Cohen, "Carboxyl Modified Polyols in Urethane Applications", in Proceedings of the SPI-32d Annual Conference, Oct. 1-8, pp. 118-125 (1989), discloses the preparation and certain reactions of carboxyl modified polyols ("CMP"). For example, the starting CMP (which can be like the base polymer of the instant invention) is treated with MDI to provide an isocyanate terminated prepolymer. The latter is then treated with a diol to form a urethane terminated prepolymer. Thus, "Slide 8" of the paper shows various ratios of starting polyol, diisocyanate, and butane diol. Slide 21 shows reacting MDI-capped base polymer with dimethylolpropionic acid (DMPA) to form ionomer, followed by chain extension with triethylamine or ethylene diamine. Acrylate-diol chain extenders are not disclosed, nor is chain-termination with an acrylate. In no case is there sufficient diisocyanate to give a final chain extended polymer. The final product is either terminated with —OH at both ends or with —OH at one end and —NCO at the other, or with —NH$_2$ (when extended with a polyamine). My process differs inter alia in that I use an excess of diisocyanate, so that the final chain-extended prepolymer is totally capped with —NCO. The latter consequence is necessary in my process, since in my final step, I add a hydroxy acrylate, the hydroxyl of which must react with the prepolymer —NCO's in order to form the final acrylate terminated photopolymer.

R. C. Hire also offered a similar paper, "Carboxyl Modified Polyols in Water-Borne Urethane Coatings," at the Water-Borne and Higher-Solids Coatings Symposium, Feb. 1-3, 1989, in New Orleans; pp. 357-358 disclose end-capping the carboxyl-grafted base polymer with a diisocyanate, followed by reaction with DMPA. This ionomer is capped with a polyamine and is then ready for water dispersion.

The two papers above are based on research at the Olin Corporation, of New Haven, Conn.

U.S. Pat. No. 4,460,738, Jul. 17, 1988, to Frentzel et al (assigned to Olin Corporation) discloses substantially the same process described in the above papers, including treating the acid grafted polyol with, e.g., MDI, and chain-extending with, e.g., butane diol. Acrylate diol chain extenders are not disclosed. The grafted —COOH reacts at least partially with —NCO to form amide. In Col. 7, lines 22–25, the ratio of —NCO groups to —OH groups in the reactants (i.e., in the acid-grafted polyols) is stated as 0.5–5:1. This will of course cap all —OH groups in the polyol, including at least partial amide formation. The product is "neutralized", e.g., with a diol. The urethane prepolymer product can be chain extended with a diamine, a diol or mixtures (Col. 7, lines 54–55). Neither dimethylolpropionic acid (DMPA) nor a (meth)acrylate(s) containing diol is mentioned as chain extenders. The chains so extended are apparently not terminated with —NCO. Example 43 of the patent discloses reacting together acid-grafted polyol, diisocyanate, and dipropylene glycol (as hardener). Again, my process differs from that of the patent, inter alia, in that the diol chain extenders used contain carboxylic acid groups optionally with photoactive (meth)acrylate groups. In my process, after the polyol-diisocyanate reaction is complete, a chain-extending diol such as DMPA is added, so that the resulting chain-extended prepolymer terminates first with hydroxyls, and then on further reaction with the excess diisocyanate present, the result is a diol chain-extended —NCO capped prepolymer. The latter class of compounds is apparently not taught in the referenced literature.

U.S. Pat. No. 4,590,255 O'Connor and Frentzel (assigned to Olin Corporation) has a disclosure similar to that in their prior U.S. Pat. No. 4,460,738. However, there is no mention of (meth)acrylate(s) containing diol chain extenders, DMPA, or hydroxyalkylmethacrylate. The final product is neither UV-curable nor water-developable.

A paper by N. Barskby and R. M. Gerkin, "Acid Grafted Polyethers: Reactive Intermediates for Use in Low VOC Coatings Applications," Proceedings of the Southern Society for Coatings Technology. 17th Annual Water-Borne and High-Solids Coatings Symposium, Feb. 21–23, 1990, discloses (in the section, "Water-Borne Polyurethanes") preparation of waterborne polyurethanes by reacting together diisocyanate, acid-grafted polyether polyol, and chain extender at 80° C. to form an isocyanate-terminated prepolymer. The chain-extender in this section is 1,4-butanediol (Table 12, Column 3). Amine is added to form a salt, and then the result is reacted with an amine chain extender or cross-linker. A water dispersion is made up and the result further chain extended, again apparently with an amine. In Table 12, Formulation 3 reacts together 100g (0.1 mole) acid-grafted polyoxypropylene diol ("PWB-1200:), 89.9 g (0.4 moles) isophorone diisocyanate (IPDI), and 24.3 g (0.27 moles) 1,4-butanediol (BDO). Since the 0.1 mole PWB1200 reacts with 0.2 mole IPDI, 0.2 mole IPDI is left for chain extension reactions, 1:1, with BDO. The BDO is thus in excess and the chain will terminate with —OH, not —NCO.

A technical brochure, "UCarmod", available from Union Carbide Corporation (1990) discloses that "Ucarmod acid-grafted polyether PWB-1200" (as used in the below examples) is "specially designed for use in water-dispersible polyurethane coatings and adhesives", but no directions are given.

Other references include:

Knopf, J. K. and Drake, K.; U.S. Pat. No. 4,528,334, "Carboxylated Poly(oxyalkylenes)", July 1985. This patent describes the preparation of acid-grafted polyether polyols that can be used as the base polymer in the instant invention.

Japanese Application 02 46460, Tomita, A. and Kawahara, K. "Photosensitive resin compositions for flexographic plates." February 1990 (Toyobo). The compositions disclosed in this reference lack carboxylic acid groups on the base polymer (a polyether polyol). Furthermore, acrylates, though present, are merely used as diluents (or fillers) and are not attached on the polyurethane polymer.

Satomi, H. et al., Japanese HEI Application 2-4255, "Light Sensitive Resin Composition", January 1990 (Toyobo). The base polymer disclosed therein to prepare a polyurethane is not a poly(oxyalkylene) and lacks carboxylic acid.

Gersdorf, J. and Kroggel, M.; European Patent Applications 374706 and 374707. June 1990 (Hoechst, A. G.) "Photocurable elastomer mixture containing esterified graft polyurethane, unsaturated monomer and initiator, useful for printing plate and photoresist production." The compositions disclosed in this patent lack carboxylic acid groups and acrylate groups on polyurethane. Acrylates are used as diluent (or fillers). Water dispersibility is obtained by grafting vinyl carboxylates on the polyurethane and then converting to —OH groups.

Gersdorf, J. et al. European Application 0351628. July 1989 (Hoechst AG.) "Photosetting elastomer mixture and recording material obtained from it for the production of relief printing plates." The polyurethane lacks carboxylic acid and acrylate groups. Acrylates are used as diluents (or fillers). Water dispersibility is obtained from —OH groups pendant on polyurethanes. In my invention water-dispersibility is obtained from carboxylic acid groups pendant on polyurethanes.

Joerg, K. and Zertani, R. West German Patent 3841025. June 1990 (Hoechst AG.) "Radiation polymerizable mixture containing saturated polyurethane-urea binder unsaturated compound and photopolymerization initiator, e.g., for photoresist or printing plate." The —COOH containing diols used for reaction with diisocyanates are not polymers. The compositions disclosed in this reference lack acrylates on the polyurethane. Acrylates are used as diluents or fillers to obtain UV curability. In one embodiment a polyether diol is used as a base polymer, but the compound is free from acid groups.

Japanese Patent Application 02077748. March 1990. (Fuji Photo Film KK.). "Photosensitive composition used for printing plate, etc., based on polyurethane resin that is insoluble in water but soluble in aqueous alkaline solution." In this reference, the polyurethane has an imide group, —CO—NH—CO that forms a ring with the polyurethane main chain. The polymer disclosed in this reference lacks both carboxylic acid groups and acrylate groups on polyurethane.

Aoai, T. et al. U.S. Pat. No. 4,950,582, "Light-sensitive Composition," March 1988 (Fuji Photo Film). This reference describes polyurethane made from base polymer that has N-sulfonyl amido groups. The base polymer lacks carboxylic acid groups and the final polyurethane lacks both carboxylic acid groups and acrylates.

In summary, the above compositions lack a major feature of my invention. In particular, this feature is a combination of three elements:

(1) the base polymer which can be a conventional polyether diol (herein base polymer Ia); an acid-grafted polyether diol (herein base polymer I) or a mixture of acid grafted polyether diol with a conventional polyether diol;

(2) the chain that extends the base polymer, which is a mixture of diols containing carboxylic acid groups and optionally photoactive (meth)acrylate groups; and (3) the hydroxyalkyl(meth)acrylate, which is used to terminate the chain ends, and is optional when photoactive (meth)acrylate groups are used in (2).

SUMMARY OF THE INVENTION

Accordingly, it is an object of the invention to prepare a photocurable composition which is suitable as an aqueous developable, storage stable, photosensitive solid surface or layer on a flexible article such as a flexible printing plate.

It is an object of the invention to provide a photosensitive article comprising the novel photocurable composition.

It is an object of the invention to provide a novel, specially tailored precursor for the aforesaid novel photocurable composition.

It is also an object of the invention to prepare a novel photopolymerizable composition wherein the composition comprises a polymer made by reacting oxide base polymer I and/or Ia with an excess of a diisocyanate (II), thereby end-capping the base polymer with —NCO. The isocyanate reacts with a hydroxyl to yield a urethane. The isocyanate end-capped product (III) in the presence of an excess of —NCO is chain extended in a second reaction with diols (IV), including a dialkylolpropionic acid and (in one embodiment) a (meth)acrylate containing diol, still in the presence of excess diisocyanate remaining after the first reaction of diisocyanate with base polymer, so that the chain extended product (V) is still —NCO terminated. In a third and final reaction (which can be omitted under conditions hereinafter explained) this (V) is treated with a hydroxyalkyl(meth)acrylate (VI) to form a photopolymer (VII). In a preferred modification two or more diols IV, one of which is dialkylolpropionic acid, are used in sequence.

It is also an object of the invention to prepare a novel photopolymerizable composition wherein the composition comprises a polymer made by reacting a carboxylic acid grafted polyalkylene oxide diol (base polymer I) with an excess of a diisocyanate (II), thereby end-capping the base polymer with —NCO. The isocyanate end-capped product (III), which contains some excess diisocyanate, is then chain extended in a second reaction with a mixture of diols including (a) a dialkylolpropionic acid and (b) a (meth)acrylate containing diol such that the diols will react with all of the isocyanate groups left from the first reaction of the diisocyanate with the base polymer I, to form the final photopolymer (VIII). In this case no hydroxyalkyl(meth)acrylate is required, but can be used if more acrylate groups are desired in the polymer.

Unless otherwise indicated the term "(meth)acrylate" is used in the conventional sense, in that it means that either —H or —CH$_3$ is attached to the alpha carbon in an acrylate moiety.

The above reactants and their use in the invention are described further below.

DETAILED DESCRIPTION

The Base Polymer—I and Ia

The base polymer I and Ia has the structure

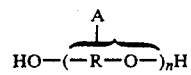

where

R is ethylene, propylene, isopropylene, butylene, isobutylene, or mixtures thereof; (—R—O—) is a polyoxyalkylene chain, commonly known as a polyether;

n is such that the molecular weight of the (—R—O—) chain varies from 500 to about 10,000;

A is H or R$^1$;

R$^1$ is —CH$_2$CH$_2$COOH, —CH$_2$CH(CH$_3$)COOH, or —CH(COOH)—CH$_2$COOH. The average number of R$^1$ units is such that they constitute about 1–30 weight percent of the total molecular weight of the (—R—O—)$_n$ chain.

The number of R$^1$ units remains substantially constant throughout the described sequence of reactions, to and including the final product(s), VII or VIII.

Where A is H the base polymer is designated as Ia; where A is R$^1$ the base polymer is designated as I. In this context R$^1$ may be considered as replacing the H in A, which otherwise is attached to carbon in R.

In the configuration given for I it will be noted that R$^1$ replaces a hydrogen on a carbon in one (or more) of the polymer segments (—R—O—). For example,

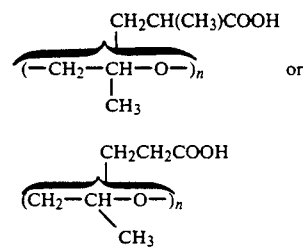

means that —CH$_2$CH(CH$_3$)COOH or —CH$_2$CH$_2$COOH has replaced an unidentified hydrogen in at least one of the polymer segments

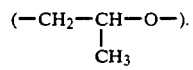

The same identities apply, mutatis mutandis, to the corresponding polymer segments following reactions of I and/or Ia with diisocyanate II to make isocyanate-capped polymer III, chain extension of III with diol(s) IV to make V, and reaction of V with hydroxyalkyl(meth)acrylate VI to make final photopolymer products(s) VII. For example, terminal non-carboxylic hydroxyls on I and/or Ia will react with diisocyanate to form III, and the resulting isocyanate end-capped III will be chain-extended with diol(s) IV, and the resulting transitory intermediate product (which is terminated by hydroxyls) reacts with diisocyanate present to provide V, which has terminal—NCO groups. V can then be reacted with hydroxyalkyl(meth)acrylate (VI) to form photopolymer VII.

In a preferred embodiment, a reaction mixture comprising a photopolymer (VIII) is made by the two following steps:

1. Base polymer I and/or IA is reacted with diisocyanate II, giving isocyanate end capped prepolymer III.

2. III is reacted with a slight excess of diol(s) IV, wherein IV is a mixture of dialkylol propionic acid and dihydroxydimethacrylate. The result comprises photopolymer VIII, which terminates with —OH originating with either of the diols.

In this two-step process, reaction with hydroxyalkylmethacrylate is omitted. Photosensitivity in the molecule is provided by the methacrylate moieties pendant in the chain.

Base polymer I thus includes polyalkylene oxide diols containing pendant carboxylic acid groups which have been grafted onto the polymer chain using (meth)acrylic acid, fumaric acid, or maleic acid in an aggregate amount of about 1–30 weight percent of the total molecular weight of the $(-R-O-)_n$ chain. The molecular weight of base polymer I can vary within the range 500 to about 10,000 and is preferably about 1000.

All of the reactions herein described using base polymer I, work equally well with base polymer Ia (non-grafted polymer), or with mixtures of I and Ia. Such mixtures can be used in any proportions, e.g., with weight ratios of I:Ia of 1–1000:1–1000. In making final photopolymers using all or predominantly Ia, it is preferable to increase the amount of -carboxyl containing diol during chain extension (cf Example 10, using Ia and no I).

Base polymer Ia as used in Example 10 was a 1000 molecular weight polyoxypropylene diol available from Union Carbide Corporation as Niax ® Polyether Polyol PPG-1025.

Molecular weights are expressed as number average.

The base polymer (I) used in Examples 1–9 and 11 was "Ucarmod PWB 1200", from Union Carbide Corporation. This material is described as having the structure

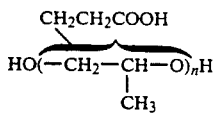

wherein n is such that the product has a molecular weight of about 1000. The acid number of the product is about 52. The available descriptive literature does not identify the polymer carbon to which the pendant group is attached. (The group replaces a H on that carbon.)

A product available from the Olin Corporation is described as a poly(propylene oxide) diol where $R^1$ is —CH(COOH)CH$_2$COOH and is attached to an alpha carbon, i.e.,

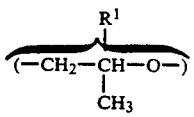

The acid-grafted base polymers (I) used in my invention can be made, e.g., by the processes described in the above-referenced U.S. Pat. No. 4,460,738 (Olin Corporation) and U.S. Pat. No. 4,528,334 (Union Carbide Corporation). In grafting methacrylic acid onto poly(oxyalkylene) compounds by the process described in U.S. Pat. No. 4,528,334, a heterogeneous mixture containing homopolymer of methacrylic acid monomer generally results along with the grafted product. Such homopolymer is considered harmless in the invention reactions and products herein described.

As noted, non-acid grafted (i.e. conventional) polyether diols can be used alone or in any proportions with carboxyl-grafted diols. Such conventional polyether polyols contain either oxyethylene or oxypropylene groups or both oxyethylene groups and higher oxyalkylene groups such as oxypropylene and oxybutylene groups, either in random or block distribution in their molecules, and have molecular weights in the range of 500 to about 10,000, and preferably, in the range of about 1000 to about 4000. These poly(oxyalkylene) compounds may be made by processes well known in the art by reacting an alkylene oxide or mixtures of alkylene oxides with a compound having from one up to as many as four active hydrogen atoms, such as water, monohydroxylic alcohols such as ethanol and propanol, dihydroxylic alcohols such as ethylene glycol and monoethyl ether of glycerine, trihydroxylic alcohols such as glycerine and trimethylolpropane, tetrahydroxylic alcohols such as pentaerythritol, hexahydroxylic alcohols such as sorbitol. The poly(oxyalkylene) products of such reactions will have linear or branched oxyalkylene or oxyethylene-higher oxalkylene chains, and such chains will terminate with hydroxyl groups.

The aforesaid non-acid-grafted polyether diols react in the same manner as the acid-grafted base polymer in the invention reactions, undergoing end-capping with diisocyanates, chain-extension with diols, and chain termination with hydroxyalkylmethacrylates. In mixtures of I and Ia the initial weight ratio of the grafted to non-grafted base polyether diols is thus maintained in their subsequent derivatives.

DIISOCYANATES—II

A wide variety of diisocyanates is available for end-capping the acid-grafted polypropylene diol I and in the subsequent diol chain extensions. These diisocyanates can be aliphatic or aromatic, with the structure OCN—$R^2$—NCO. The divalent radical $R^2$ contains in general 2 to 20, preferably 6 to 15 carbon atoms and may optionally carry non-interfering substitutents such as ether groups, ester groups, urethane groups, amido groups, urea groups, or halogen atoms. Examples of suitable diisocyanates include 4,4'-methylene diphenyl diisocyanate (MDI), 2,4-tolylene diisocyanate (toluene diisocyanate), dimer of 2,4-tolylene-diisocyanate, 2,6-tolylenediisocyanate, p-xylenediisocyanate, m-xylenediisocyanate, 1,5-naphthylene diisocyanate, 3,3'-dimethylbiphenyl-4,4'-diisocyanate, hexamethylene diisocyanate, trimethylhexamethylene diisocyanate, lysine diisocyanate, isophorone diisocyanate, 4,4'-methylenebis(cyclohexylisocyanate), methylcyclohexane-2,4(or 2,6)-diisocyanate, 1,3-(isocyanatomethyl)cyclohexane, and m-tetramethylxylene diisocyanate.

Conventional urethane-forming catalysts may be used in the reactions with diisocyanates. These catalysts include, e.g., organo-tin compounds such as dibutyl tin dilaurate and stannous octoate, organo-mercury compounds, tertiary amines, and mixtures of these materials.

The initial reaction product of the base polymer I (and/or Ia) with excess diisocyanate II is an isocyanate-capped prepolymer, III:

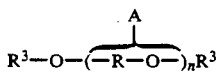

where $R^3$ is $-C(:O)-NH-R^2-NCO$.

III may be formed in multiples, i.e., III may react with more base polymer I (and/or Ia, as the case may be), forming chains comprising III and e.g., I, joined by urethane linkages ($-NHC(:O)-O-$), e.g., III-I-III, III-I-III-I-III, III-I-III-I-III-I-III, etc.

While an excess of diisocyanate II is required in order to ensure complete $-NCO$ capping of base polymer and to ensure that enough isocyanate groups are left to react with diols IV to chain extend the $-NCO$-capped base polymer to increase the molecular weight to obtain a solid polymer, too great an excess should be avoided because it increases the hardness of the final photopolymer. If the photopolymer is too hard, it will not form a good flexographic printing plate. The ratio of $-NCO$ in the diisocyanate II to $-OH$ in the base polymer should exceed 1, and preferably should be about 3–6:1, and even more preferably, about 3–4:1.

DIOL(S)—IV

Once III is formed, diol IV is added pursuant to the invention process and functions to chain-extend III, to increase the molecular weight to ensure that the final polymer is a solid material.

The diols used here have the structure $HO-R^4-OH$, where $R^4$ is inherently defined below by reference to actual classes of suitable diols.

The three suitable classes of diols used in this invention are:
(1) Diols containing a free carboxylic acid group and having a molecular weight less than 500, e.g., a dialkylolpropionic acid.
(2) Carboxyl-free diols having a molecular weight less than 500, e.g. alkane diols.
(3) (Meth)acrylate(s) containing diols.

The above diol chain extenders can be used as mixtures or in sequence.

The invention requires that at least one of the chain extending diols carry a free carboxylic acid group, $-COOH$. Such diol distinguishes from the base polymers I and Ia in that the molecular weight is less than 500. A preferred class of such acid containing diols is the dialkylolpropionic acid, $HO-(C_mH_{2m})-CH(COOH)-(C_mH_{2m})-OH$, where m is 1–4, preferably 1, thus giving dimethylolpropionic acid (DMPA). Such diols both chain extend and introduce $-COOH$ groups into the polymer chain. The carboxylic acid groups aid water-dispersibility of the final photopolymer composition.

Another class of suitable diols is the carboxylic acid-free diols. These can be alkane diols such as ethylene glycol, 1,4-butanediol, 1,6-hexanediol, cyclohexanedimethanol, and the like.

A very useful diol is a di- or mono(meth)acrylate containing diol with the structure $$R^6-(CH_2)_p-R^5$$

where
$R^5$ is $-C(:O)OCH_2CH(OH)-CH_2OC(:O)-C(R_7)=CH_2$ or $-OCH_2CH(OH)-CH_2O-OC(:O)-C(R^7)=CH_2$ where
$R^7$ is $-CH_3$ or $-H$;

$R^6$ is $R^5$, $-C(:O)O-CH_2CH(OH)CH_2O-R^8$, or $-OCH_2CH(OH)CH_2-OC(:O)-R^8$,
where
$R^8$ is $C_pH_{2p+1}$ and p is 1–20.

The (meth)acrylate(s) containing diol functions both (a) as chain extender (i.e. the two hydroxyl groups react with the isocyanates to give urethane linkages) and (b) to introduce photocurable (meth)acrylate sites along the polymer backbone to improve resistance to ink swell. These groups are in addition to any (meth)acrylate groups introduced in the third reaction with the hydroxyalkyl(meth)acrylates to make the photopolymer VII (as described elsewhere).

The basic chain extension reaction is III+IV=IV-III-IV. IV-III-IV is transitory, and its two terminal hydroxyl groups react with excess diisocyanate II and/or more III and/or byproducts of II and IV such as IV-II, II-IV-II, and multiples of these. Various of these products are believed to enter into the reactions for chain extending the isocyanate-capped base polymer III, forming compounds such as III-IV-II, III-IV-III-IV-II, II-IV-III-IV-III, III-IV-III, etc., all of which are isocyanate-capped because of the excess of diisocyanate II in the reaction mixture.

As noted, diol(s) IV react with isocyanate-capped polymer III and also with excess unreacted diisocyanate II to form a mixture designated as V.

In the simplest case of V, starting with diol IV and III where III is II-I(and/or Ia)-II, the chain extension reaction mixture will contain, inter alia, compounds of the structure

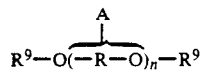

where $R^9$ is $-C(:O)-NH-R^2NH-C(:O)-O-R^4-O-R^3$.

At least some of diol IV will be dialkylolpropionic acid, and in one embodiment will additionally contain (meth)acrylate(s) containing diol, so that $R^4$ will contain some carboxylic acid groups and some (meth)acrylate groups.

In a preferred mode of chain extension, (a) a (meth)acrylate containing diol (e.g., dihydroxydimethacrylate) is added to the isocyanate-capped base polymer III; (b) the resulting reaction mixture is fully reacted at ambient temperature (about 18°–25° C.; (c) a mixture of dialkylolpropionic acid (e.g., dimethylolpropionic acid) and an alkane diol (2–10 carbons) (e.g., 1,4-butane diol) is added; and (d) the resulting mixture is heated to about 50°–65° C. to complete the chain extension.

The resulting polymer thus contains pendant carboxylic acid groups (from dialkylolpropionic acid) for improved water dispersibility and, in one embodiment, (meth)acrylate groups for additional UV curability to increase the crosslinking density and hence resistance to ink swell. The polymer may be considered as final photopolymer VIII, or if further reaction with hydroxy(meth)acrylate is intended, as prepolymer V.

Dihydroxydimethacrylate can be prepared in various ways, e.g., as shown in Examples 3 and 4 below.

A uniquely useful form of V is III chain-extended with three different segments, (-II-IV), where the diols IV include (a) a carboxyl-containing diol of molecular weight less than 500, e.g., a dialkylolpropionic acid (always essential), (b) a carboxyl-free diol less than 500 molecular weight, e.g., an alkane diol such as 1,4-butane diol, and (c) a (meth)acrylate(s) containing diol, e.g., dihydroxydimethylacrylate. The resulting chain is terminated by hydroxyls or by II, depending on whether diols or diisocyanates are in excess.

HYDROXYALKYL(METH)ACRYLATES—VI

The final step in forming photopolymer VII is end-capping V with hydroxyalkyl(meth)acrylate VI. VI has the structure $CH_2=C(R^7)-C(:O)-O-(R^{10})OH$ where $R^{10}$ is lower alkalene ($C_{2-6}$).

A number of such hydroxyalkyl(meth)acrylates (VI) are available e.g., hydroxyethyl methacrylate, hydroxypropyl methacrylate, hydroxyethyl acrylate, and the like.

The reaction of V and VI gives the final photopolymer product, VII, which is a mixture comprising compounds having (in the simplest case) the structure

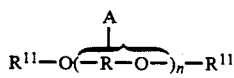

where $R^{11}$ is $-C(:O)-NH-R^2-NH-C(:O)-O-R^4-O-C(:O)NH-R^2-NH$ $CH_2=C(R^7)-C(:O)-O-(R^{10})-O-(C:O)-$.

The generic group of compounds formed by the reaction of V with VI is referred to as VI-V-VI, or VII.

Since VI will react with all —NCO terminated compounds in the reaction mixture whether or not they contain segments of I and/or Ia, a variety of related reactions will also occur, resulting in compounds such as VI-II-VI, VI-III-VI, etc. Such simultaneously produced congeners are included in VII.

To make a photopolymer this final step (reaction of V with VI) is optional if a sufficient amount of (meth)acrylate(s) diols IV has already been added to react with all of the isocyanates of III.

When a reaction mixture is made using as I, poly(oxypropylene) diol, molecular weight of about 1000, with $R^1=-CH_2CH_2COOH$, tolylene diisocyanate as II, a mixture of 1,4-butane diol and methylolpropionic acid as IV, and finally hydroxyethylmethacrylate as VI, the resulting composition is believed to include a photopolymer of the following composition (cf Example 2):

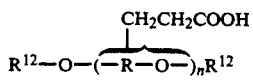

where n is about 15-20, there is about one $-CH_2CH_2COOH$ group per molecule of I, and $R^{12}$ is

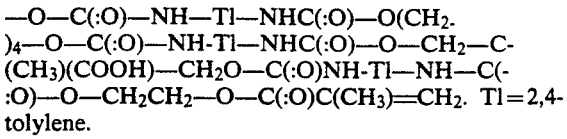

$Tl=2,4$-tolylene.

The compound shown represents a theoretical and probable structure. Other, similar structures are believed present. The two side chains, here shown as $R^{12}$, will often not be identical to $R^{12}$ or to each other. Also, the number of base polymer segments $[(-R-O)_n]$ per photopolymer molecule may be more than 1, e.g. 2, 3, 4, etc. In the general case, however, the final photopolymer will comprise as components, base polymer, diisocyanate, low molecular weight diol, and hydroxyalkylmethacrylate. Chain extending diols will alternate via urethane linkages with diisocyanates.

When a reaction mixture is made up following the same procedure as above except adding the diol chain extender in two stages, the first being a mixture of dimethylolpropionic acid and a (meth)acrylate(s) containing diol, e.g., dihydroxydimethacrylate, followed by tolylene diisocyanate (Tl) and 1,4-butane diol, the final reaction mixture resulting from these species is considered to contain inter alia a photopolymer of the following composition (cf Example 7):

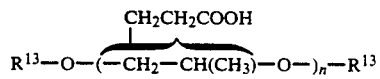

where $R^{13}$ is

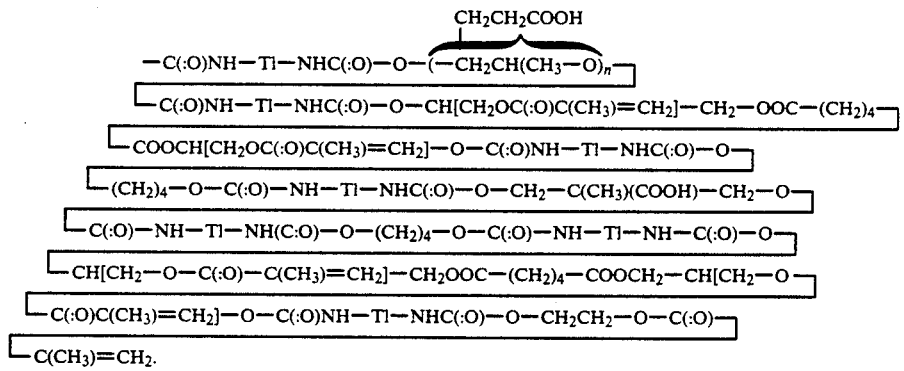

The compound shown represents a theoretical but probable structure. Similar structures are expected to be present in the reaction mixture. The two side chains, here represented by $R^{13}$, will often not be identical to the above $R^{13}$, and further, the side chains will often differ on the same base polymer. Also, the number of base polymer segments $[(-R-O-)_n]$ (three in the structure shown) will often not be three, but may be 1, 2, 4, etc. In the general case, however, the final photopolymer will comprise as segment components, base polymer, diisocyanate, low molecular weight diol(s), and hydroxyalkylmethacrylate. The low molecular weight diol(s) can be dimethylolpropionic acid, together with dihydroxydimethacrylate or with butane diol, or with a mixture of butanediol and dihydroxydimethacrylate. Diisocyanate and diol (suitable two or three different diols) will alternate as in the previous description.

PREPARATION OF PHOTOPOLYMER VIII (NO HYDROXYALKYL(METHYL)ACRYLATE)

When a reaction mixture is made using as I, poly(oxypropylene)diol, molecular weight of about 1000, with $R^1$=—$CH_2CH_2COOH$; tolylene diisocyanate as II; and an excess of dimethylolpropionic acid and dihydroxydimethacrylate as IV, the final step of end-capping with hydroxyalkyl(meth)acrylate can be omitted, and the final reaction mixture is photopolymer VIII, believed to comprise a compound of the following composition (cf Example 8):

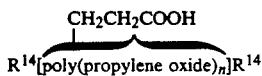

where $R^{14}$ is

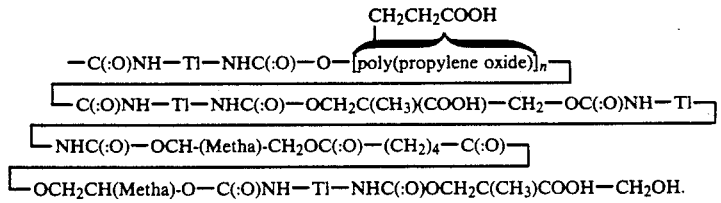

Poly(propylene oxide)=$(C_3H_6—O—)$
Tl—tolylene
Metha=$CH_2$=$C(CH_3)C(:O)$—$OCH_2$— n is such that the base polymer has a molecular weight of about 1000.

The compound shown is only a theoretical representative structure. Similar structures are expected to be present in the reaction mixture. The two side chains, here represented as $R^{14}$, will often not be identical to the above $R^{14}$, and further the side chains will often differ on the same base polymer. The number of base polymer segments [$(C_3H_6$—$O$—$)_n$] (three in the structure shown) may be 1, 2, 3, 4 or more. In the general case, the final polymer will comprise as segment components base polymer, diisocyanate, dimethylolpropionic acid, and dihydroxydimethacrylate. Diisocyanate, base polymer, and diols will alternate along the polymer chain.

SOLVENT

All the above reactions are suitably carried out in an anhydrous organic solvent. The intermediate products (e.g., reaction mixtures containing isocyanate-capped polyoxypropylene ether) can be recovered at each stage; however, when one is aiming at the final photopolymer, this is neither necessary nor desirable.

Suitable solvents include N,N-dimethyl formamide, dimethyl acetamide, dimethylsulfoxide, 4-methyl-2-pentanone, methyl ethyl ketone, and mixtures thereof.

To summarize, the acid-grafted polyether diol is first reacted with an excess of diisocyanate. The thus-formed isocyanate-capped polyether diols are then chain extended with a low-molecular weight carboxyl-containing diol, e.g., dialkylolpropionic acid, additionally with low molecular weight diols that do not contain carboxyl groups, e.g., 1,4-butanediol and/or with (meth)acrylate(s) containing diols, e.g., dihydroxydi(meth)acrylate, to increase the molecular weight so as to form a solid polymer, to impart water-dispersibility, and/or (as the case may be) to help provide UV-curability. Whether or not (meth)acrylates-containing diols are added in the chain-extension step, the chain-extended product can be treated further in a third (and final) step with a hydroxyalkyl(meth)acrylate such as hydroxyethylmethacrylate or hydroxypropylmethacrylate to terminate the chains with (meth)acrylates. When little or no (meth)acrylate(s)-containing diol is added in the chain-extension reaction, it is necessary to add a hydroxyalkylmethacrylate as aforesaid to make a photopolymer. The (meth)acrylate groups provide UV-curability to the polymer. The carboxylic acid groups impart water dispersibility to develop the UV-exposed plates prepared with the photopolymer.

In these reactions, the reaction temperature was maintained low enough (usually below 80° C.) so that esterification of the carboxylic acid groups by the hydroxyl groups and side reactions of the acid groups with the isocyanate groups could not occur.

The resulting photopolymer (VII or VIII, and preferably still in its reaction solvent) is then mixed with (a) some mono-, di- or multifunctional methacrylates or acrylates at a level of about 5 to 30 weight percent; (b) a photoinitiator (typically 0.5 to 1%), and (c) (optional) potassium hydroxide or other base to neutralize the carboxylic acid groups and to form an ionomer. The formulation is then casted on a metal coated backing or a polyester backing. After drying to remove the solvent, the dry solid plate is subjected to UV exposure through a negative to form the cured image. The imaged plate is then washed with an aqueous alkaline solution (such as 1% sodium carbonate) or an aqueous surfactant mixture to remove the area unexposed to UV radiation, thereby leaving a relief or lithographic image or the like.

FORMULATIONS WITH PHOTOPOLYMER VII OR VIII REACTIVE MONOMER (ACRYLATES)

The simplest formulation is photopolymer VII or VIII plus an effective amount of photoinitiator. Such mixture can be solvent cast, as is, or the solvent removed and extruded to create a solid photopolymerizable layer o conventional backing materials. However, it is preferable to formulate or extend the photopolymerizable composition with about 1 to 30% by weight of reactive (i.e., photoactive) monomer, and most preferably in the range of 5 to 20% by weight reactive monomer. Suitable reactive monomers are those of the formula:

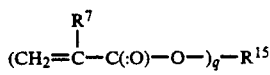

wherein $R^7$ is hydrogen or methyl, and $R^{15}$ is an organic moiety having the valence of q, and q is 1 or more.

Such reactive (meth)acrylate diluents include, but are not limited to, trimethylolpropane triacrylate, hexanediol diacrylate, 1,3-butylene glycol diacrylate, diethylene glycol diacrylate, 1,6-hexanediol diacrylate, neopentyl glycol diacrylate, polyethylene glycol 200 diacrylate, tetraethylene glycol diacrylate, triethylene glycol diacrylate, pentaerythritol tetraacrylate, tripropylene glycol diacrylate, ethoxylated bisphenol-A diacrylate, propylene glycol mono/dimethacrylate, trimethylolpropane diacrylate, ditrimethylolpropane tetraacrylate, triacrylate of tris(hydroxyethyl) isocyanurate, dipentaerythritol hydroxypentaacrylate, pentaerythritol triacrylate, ethoxylated trimethylolpropane triacrylate, triethylene glycol dimethacrylate, ethylene glycol dimethacrylate, tetraethylene glycol dimethacrylate, polyethylene glycol-200 dimethacrylate, 1,6-hexanediol dimethacrylate, neopentyl glycol dimethacrylate, polyethylene glycol-600 dimethacrylate, 1,3-butylene glycol dimethacrylate, ethoxylated bisphenol-A dimethacrylate, trimethylolpropane trimethacrylate, diethylene glycol dimethacrylate, 1,4-butanediol diacrylate, diethylene glycol dimethacrylate, pentaerythritol tetramethacrylate, glycerin dimethacrylate, trimethylolpropane dimethacrylate, pentaerythritol trimethacrylate, pentaerythritol dimethacrylate, pentaerythritol diacrylate, urethane-methacrylate or acrylate oligomers and the like which can be added to the photopolymerizable composition to modify the cured product. Monoacrylates such as cyclohexyl acrylate, isobornyl acrylate, lauryl acrylate and tetrahydrofurfuryl acrylate and the corresponding methacrylates are also operable as reactive diluents.

PHOTOINITIATORS

The formulations comprising the novel materials of this invention require a photoinitiator. A large number are available and useful.

Photoinitiators for the photopolymerizable composition and formulations containing the same include the benzoin alkyl ethers, such as benzoin methyl ether, benzoin ethyl ether, benzoin isopropyl ether and benzoin isobutyl ether. Another class of photoinitiators are the dialkoxyacetophenones exemplified by 2,2-dimethoxy-2-phenylacetophenone, i.e. Irgacure ®651 (Ciba-Geigy) and 2,2-diethoxy-2-phenylacetophenone. Still another class of photoinitiators are the aldehyde and ketone carbonyl compounds having at least one aromatic nucleus attached directly to the carboxyl group. These photoinitiators include, but are not limited to benzophenone, acteophenone, o-methoxybenzophenone, acenaphthenequinone, methyl ethyl ketone, valerophenone, hexanophenone, alpha-phenylbutyrophenone, p-morpholinopropiophenone, dibenzosuberone, 4-morpholinobenzophenone, 4'-morpholinodeoxybenzoin, p-diacetylbenzene, 4-aminobenzophenone, 4'-methoxyacetophenone, benzaldehyde, alpha-tetralone, 9-acetylphenanthrene, 2-acetylphenanthrene, 10-thioxanthenone, 3-acetylphenanthrene, 3-acetylindone, 9-fluorenone, 1-indanone, 1,3,5-triacetylbenzene, thioxanthen-9-one, xanthene-9-one, 7-H-benz[de]-anthracen-7-one, 1-naphthaldehyde, 4,4'-bis(dimethylamino)-benzophenone, fluorene-9-one, 1'-acetonaphthone, 2'-acetonaphthone, 2,3-butanedione, acetonaphthene, benz[a]anthracene 7.12 diene, etc. Phosphines such as triphenylphosphine and tri-o-tolylphosphine are also operable herein as photoinitiators. The photoinitiators or mixtures thereof are usually added in an amount ranging from 0.01 to 5% by weight of the total composition.

OTHER ADDITIVES

Other additives to the photocurable composition can be included. To inhibit premature crosslinking during storage of the prepolymer containing compositions of this invention, thermal polymerization inhibitors and stabilizers are added. Such stabilizers are well known in the art, and include, but are not limited to, hydroquinone monobenzyl ether, methyl hydroquinone, amyl quinone, amyloxyhydroquinone, n-butylphenol, phenol, hydroquinone monopropyl ether, phenothiazine, and nitrobenzene, and mixtures thereof. Such additives are used in an amount within the range of from about 0.01 to about 2% by weight of the prepolymer. These stabilizers are effective in preventing crosslinking of the prepolymer composition during preparation, processing and storage.

The compositions also may contain up to about 50% by weight of an inert particulate filler which is essentially transparent to actinic light. Such fillers include the organophilic silicas, bentonites, silica and powdered glass. Such fillers can impart desirable properties to the photocurable compositions and reliefs on printing plates containing those compositions.

Formulations using the photopolymers of this invention (including VII and VIII) include the following (in parts by weight):

(1) Photopolymer, about 10-100, preferably about 70-90;
(2) Aromatic or aliphatic urethane acrylate, about 5-30, preferably about 10-20;
(3) Trimethylolpropane, or any acrylate diluent, about 0-20, preferably about 5-10.
(4) Photoinitiator, about 0.1-10, preferably about 0.5-1.0;
(5) Organic solvent, about 0-200, preferably about 10-40; the organic solvent suitably comprises toluene, about 0-10 and 2-propanol, about 6-20;
(6) Potassium hydroxide solution (e.g., about 20 weight % in methanol), about 0-20, preferably about 5-20.

PREPARATION OF PLATE

The photocurable composition can then be shaped and formed as a solid layer of suitable thickness according to conventional solvent casting, i.e., dissolving the composition in a solvent, shaping the solution into a film or plate and removing the solvent. Conventional extrusion calendaring or hot press techniques can also be used. Solid layers of the photosensitive composition in the form of a film can be adhered to supports such as those comprising polyester, nylon or polycarbonate. Other suitable supports include woven fabrics and mats, e.g. glass fiber fabrics or laminated materials made of for example, glass fibers and plastics, and steel or aluminum coated plates. It is preferred that the supports are dimensionally stable and resistant to the washout solutions.

It is also usually necessary to protect photosensitive surfaces from contamination by dirt and dust during storage before being exposed and washed. Such protection is accomplished by lamination or application of a flexible protective cover sheet to the side of the photocurable composition opposite that of the support. In addition, the photocurable compositions can sometimes be tacky and it is thus also desirable to apply a release film to the surface of the photosensitive layer before application of the coversheet. The release film may consist of a thin, flexible and water dispersible polymeric film and allows for intimate contact between the surface of the photocurable composition opposite to the support and an image bearing negative applied to the surface.

EXPOSURE AND DEVELOPMENT

Photosensitive articles comprising a support having a solid layer or surface comprising the photocurable composition, e.g. solid flexographic printing plates, can then be processed by well known techniques for imagewise exposure to actinic light. Preferably, the light should have a wavelength of from about 230–450 microns. Exposure is through a negative placed between the light source and the photosensitive surface. Suitable sources of light include Type RS sunlamps, carbon arc lamps, xenon arc lamps, mercury vapor lamps, tungsten halide lamps and the like.

Exposure periods depend upon the intensity of the actinic light, thickness of the plate and the depth of the relief desired on the printing plate. Periods of from 2 to 20 minute exposures are preferred.

After exposure and the negative has been removed, the unexposed areas of the photosensitive surface can be developed in aqueous solutions. Suitable solutions include alkaline aqueous solutions as well as nonionic, cationic, and amphoteric surfactants or combinations thereof. A preferred washout solution is 1% aqueous sodium carbonate solution.

The reactions involved in the invention are summarized schematically below. Side reactions are omitted. For details see the example.

closed with a hydroxyalkylmethacrylate (the terminal UV-sensitive unit).

Base polymer I and/or Ia chain extended with DMPA and 1,4-butane diol gives a satisfactory water-developable photopolymer when the chain is terminated with an acrylate. A better photopolymer results however by chain extending with DMPA and dihydroxydimethacrylate, in that the polymer tends not to swell as much in aqueous inks. I greatly prefer chain extension using DMPA and a dihydroxydimethacrylate, since use of these two in chain extension results in good washability and minimizes swelling in inks. Resistance to ink swell is important in the developed printing plate, since swelling can cause unacceptable deformities in the relief areas and hence poor printing. The following Examples illustrate without limiting the invention.

EXAMPLE 1

Preparation of an Acid Modified Polyurethane-Acrylate From 4,4'-Methylene Diphenyldiisocyanate (MDI)

The reactants used in the synthesis are as follows:

| Materials | Source | Trade name or Abbreviation | Mole Ratio | Weight (grams) |
|---|---|---|---|---|
| MDI | Mobay | Mondur M | 6 | 100 |
| PWB-1200 | Union Carbide | Ucarmod | 2 | 148 |
| 1,4-Butanediol | Aldrich | BDO | 1 | 6.0 |
| Dimethylolpropionic acid | Aldrich | DMPA | 2 | 17.8 |

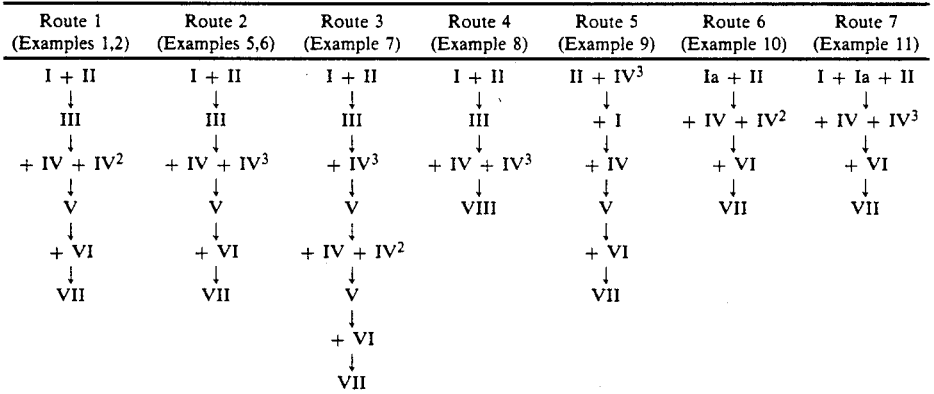

Code:
I = carboxylic acid grafted polyether diol base polymer
Ia = non-acid grafted (i.e. conventional) polyether diol base polymer
II = diisocyanate in excess
III = isocyanate capped prepolymer with excess diisocyanate
IV = dimethylolpropionic acid
IV$^2$ = 1,4-butanediol
IV$^3$ = (meth)acrylate-containing diol
V = base polymer chain extended with diols and terminating with isocyanate
VII = final photopolymer terminated with hydroxyalkyl(meth)acrylate
VIII = final photopolymer with pendant acid groups and (meth)acrylate groups, no terminal hydroxyalkyl(meth)acrylates It will be noted that the first three routes are similar except for the step(s) for diol chain extension. The chain extension operation is unique in that each chain extension segment has a dual function. The dialkylol propionic acid both chain-extends and, through its —COOH group, provides water dispersibility. The alkane diol extends the chain and provides solidity to the polymer. The dihydroxydimethacrylate extends the chain and provides UV-crosslinkability and resistance to ink swell. And all this is built into the chain before it is

| Hydroxyethyl methacrylate | Rohm and Haas | Rocryl 400 | 2 | 17.2 |
|---|---|---|---|---|
| Geltrol | B F Goodrich | Good-Rite A.O. 3113 | | 1.8 |
| 4-Methoxyphenol | Aldrich | MEHQ | | 0.9 |
| 2,6-Di-t-Butyl-4-Methylphenol | Aldrich | BHT | | 0.3 |
| Irganox 1010 | Ciba-Geigy | | | 0.3 |
| N,N-Dimethyl Formamide | Aldrich | DMF | | 181.5 |

MDI was first melted by heating to 60° C. under nitrogen. Geltrol, MEHQ and BHT were dissolved in 10 grams of DMF and added to the acid grafted polyether polyol PWB-1200. This solution was then added to the molten MDI in the resin kettle under vigorous stirring. The exotherm will bring the reaction temperature to about 75° C. After about one hour, when the exotherm has subsided, a solution of DMPA and BDO in 100 grams of DMF was added to reaction mixture. About 70 more grams of DMF was also added to reduce the viscosity and facilitate mixing. After about 2-3 hours at 60°-70° C., and when the exotherm has subsided, Hydroxyethylmethacrylate was introduced into the reaction mixture and additional application of heat was removed. Irganox 1010 dissolved in 1.5 grams of DMF was then added. The reaction mixture was allowed to mix for another 4-5 hours or until the IR spectrum showed the complete disappearance of the isocyanate peak at about 2265 cm$^{-1}$. The resultant mixture was formulated as described in Example 12 below.

Geltrol, an antigelation agent, is a phosphite polyalkyl polyphenol.

Irganox 1010, MEHQ, and BHT function as stabilizers.

Irganox 1010 is tetrakis [methylene 3-(3',5'-di-tert-butyl-4'-hydroxyphenyl)propionate] methane.

The following schematic indicates some of the principal reactions believed to occur in Example 1, together with some of the major products.

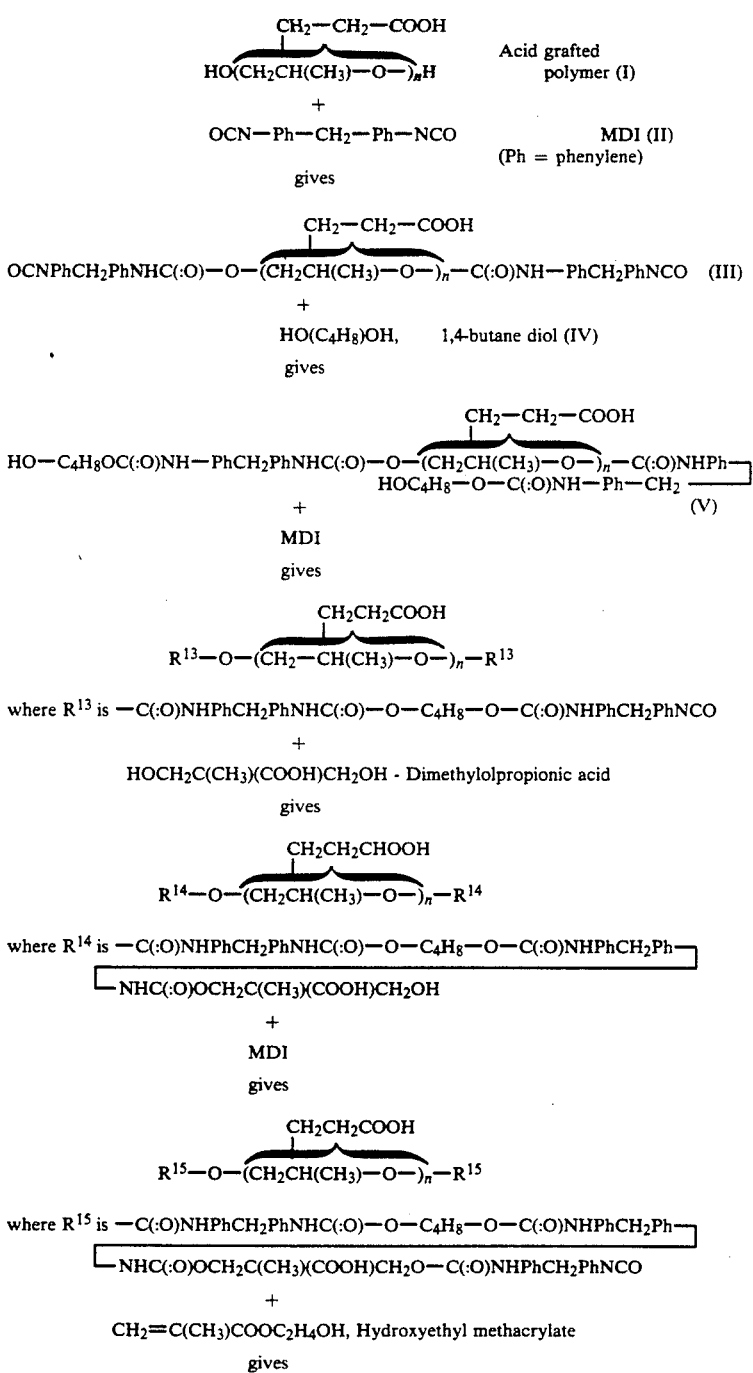

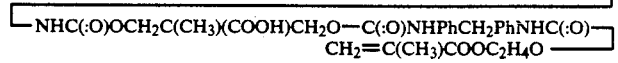

where $R^{16}$ is $-C(:O)NHPhCH_2PhNHC(:O)-O-C_4H_8-O-C(:O)NHPhCH_2Ph-$
$-NHC(:O)OCH_2C(CH_3)(COOH)CH_2O-C(:O)NHPhCH_2PhNHC(:O)-$
$CH_2=C(CH_3)COOC_2H_4O-$ This final product is an invention photopolymer. Obviously, a large number of similar products are made at the same time; some are photopolymers, some not. The total mixture is, however, photopolymeric.

EXAMPLE 2

Preparation of an Acid Modified Polyurethane-Acrylate from Toluene Diisocyanate (TDI)

The reactants used in the synthesis are as follows:

| Materials | Source | Trade Name or Abbreviation | Mole Ratio | Weight (grams) |
|---|---|---|---|---|
| TDI | Mobay | Mondur TD80 | 7 | 50 |
| PWB-1200 | Union Carbide | Ucarmod | 2 | 91.1 |
| 1,4-Butanediol | Aldrich | BDO | 2 | 7.4 |
| Dimethylol-propionic acid | Aldrich | DMPA | 2 | 11.0 |
| Hydroxyethyl methacrylate | Rohm and Haas | Rocryl 400 | 2 | 10.6 |
| Geltrol | B F Goodrich | Good-Rite A.O. 3113 | | 0.34 |
| 4-Methoxyphenol | Aldrich | MEHQ | | 0.34 |
| 2,6-Di-t-Butyl-4-methoxyphenol | Aldrich | BHT | | 0.36 |
| Methyl Isobutyl Ketone | Aldrich | MIBK | | 65 |
| N,N-Dimethyl formamide | Aldrich | DMF | | 60 |

TDI was charged to a resin kettle purged with nitrogen. The acid grafted polyether polyol PWB-1200 was then added to TDI under vigorous stirring. The exotherm raised the reaction temperature to 45° C. After about 2.5 hours, when the exotherm has subsided, and the isocyanate content was 2.9 milliequivalents per gram, a solution of BDO and DMPA in 60 grams MIBK and 60 grams DMF was added to the reaction mixture under constant stirring. The exotherm brought the reaction temperature to about 37° C. After about 2 hours, a solution of Geltrol/MEHQ/BHT dissolved in 5 grams of DMF was then added. The reaction was allowed to stir for about 2 hours and hydroxyethylmethacrylate was added. The reaction was then allowed to proceed for another 17 hours at 25° C. and then heated to 60° C. with the addition of about 0.05 grams of dibutyl tin dilaurate catalyst until the IR spectrum did not show any isocyanate peak at about 2265 cm$^{-1}$. The resulting mixture was formulated as described in Example 13 below.

EXAMPLE 3

Preparation of a Dihydroxydimethacrylate Chain Extender from Adipic Acid and Glycidyl Methacrylate (hereafter, referred as Chain Extender A)

A resin kettle equipped with a mechanical stirrer, a thermometer and a condenser was charged with 36.5 grams (0.25 moles) of adipic acid, 71.1 grams (0.5 moles) of glycidyl methacrylate , 0.5 grams of 4-methoxyphenol (as stabilizer) and 0.05 grams of 1,8-diazabicyclo [5.4.0] undec-7-ene (as catalyst). The mixture was reacted at 100°-110° C. for about 12 hours until the IR spectrum showed the complete disappearance of (a) the acid carbonyl peak at about 1710 cm$^{-1}$ and (b) the epoxide peak at about 912 cm$^{-1}$. The resulting product is a clear viscous liquid, hereafter referred as CHAIN EXTENDER A.

EXAMPLE 4

Preparation of a Dihydroxydimethacrylate Chain Extender from 1,4-Butanediol Diglycidyl Ether and Acrylic Acid (hereafter, referred as CHAIN EXTENDER B)

121.2 grams (0.6 moles) of 1,4-butanediol diglycidyl ether was charged to a resin kettle equipped with a mechanical stirrer, a thermometer and a condenser. 86.4 grams (1.2 moles) of acrylic acid was added followed by 1.05 grams of 4-methoxyphenol and 0.15 grams of 1,8-diazabicyclo [5.4.0] undec-7-ene. The resulting mixture was heated at 100°-100° C. for a minimum of 10 hours until the IR spectrum showed the complete disappearance of the acid carbonyl peak at about 1710 cm$^{-1}$ and the epoxide peak at 912 cm$^{-1}$ followed by the appearance of the hydroxyl peak at about 3500 cm$^{-1}$. The resulting product is an amber, transparent liquid (hereafter, referred as CHAIN EXTENDER B)

EXAMPLE 5

Preparation of an Acid-Containing Polyurethane-Acrylate Using Chain Extender A Prepared in Example 3

The reactants used in the synthesis are shown below:

| Materials | Source | Trade name or Abbreviation | Mole Ratio | Weight (grams) |
|---|---|---|---|---|
| TDI | Mobay | Mondur TD80 | 7 | 50.0 |
| PWB-1200 | Union Carbide | Ucarmod | 2 | 91.1 |
| Chain Extender A | Example 3 | — | 2 | 35.9 |
| Dimethylol-propionic acid | Aldrich | DMPA | 2 | 11.0 |
| Hydroxyethyl methacrylate | Rohm and Haas | Rocryl 400 | 2 | 10.6 |
| 4-Methoxyphenol | Aldrich | MEHQ | | 0.34 |
| Geltrol | B F Goodrich | Good-Rite A.O. 3113 | | 0.34 |
| 2,6-Di-t-Butyl-4-Methylphenol | Aldrich | BHT | | 0.34 |
| Methyl Isobutyl Ketone | Aldrich | MIBK | | 65 |
| N,N-Dimethyl Formamide | Aldrich | DMF | | 60 |
| Dibutyl Tin | Air | DABCO | | 0.125 |

| Materials | Source | Trade name or Abbreviation | Mole Ratio | Weight (grams) |
|---|---|---|---|---|
| Dilaurate | Products | T-12 | | |

TDI was charged to a resin kettle equipped with a mechanical stirrer, a thermometer, a nitrogen inlet and an addition funnel. The polyether polyol Ucarmod PWB-1200 was introduced in the reaction vessel under vigorous stirring. The exotherm raised the temperature to about 35°–40° C. After about 3 hours, when the exotherm has subsided, or when the isocyanate content has reached a level of 2.9 milliequivalents per gram, a solution of dimethylol propionic acid and Chain Extender A dissolved in DMF and MIBK was added, followed by the addition of the stabilizers Geltrol, MEHQ and BHT. The exotherm increased the reaction temperature to about 40° C. The reaction mixture was allowed to proceed for about 24 hours, until the isocyanate content is about 0.26 milliequivalents per gram. Then, hydroxyethyl methacrylate was added along with the catalyst dibutyl tin dilaurate. The mixture was heated at 60° C. until there was no isocyanate peak at about 2265 cm$^{-1}$ in the IR spectrum. (See Example 14 for formulation)

EXAMPLE 6

Preparation of an Acid-Containing Polyurethane-Acrylate Using Chain Extender B Prepared in Example 4

The reactants used in the synthesis are as follows:

| Materials | Source | Trade Name or Abbreviation | Mole Ratio | Weight (grams) |
|---|---|---|---|---|
| TDI | Mobay | Mondur TD80 | 7 | 50.0 |
| PWB-1200 | Union Carbide | Ucarmod | 2 | 91.1 |
| Chain Extender B | Example 4 | | 2 | 28.5 |
| Dimethylolpropionic acid | Aldrich | DMPA | 2 | 11.0 |
| Hydroxyethyl methacrylate | Rohm and Haas | Rocryl 400 | 2 | 10.6 |
| 4-Methoxyphenol | Aldrich | MEHQ | | 0.34 |
| Geltrol | B F Goodrich | Good-Rite A.O. 3113 | | 0.34 |
| 2,6-Di-t-Butyl-4-Methylphenol | Aldrich | BHT | | 0.34 |
| Methyl Isobutyl Ketone | Aldrich | MIBK | | 65 |
| N,N-Dimethyl Formamide | Aldrich | DMF | | 60 |
| Dibutyl Tin Dilaurate | Air Products | DABCO T-12 | | 0.125 |

TDI was charged to a resin kettle equipped with a mechanical stirrer, a thermometer, a nitrogen inlet and an addition funnel. The polyether polyol Ucarmod PWB-1200 was introduced in the reaction vessel under vigorous stirring. The exotherm raised the temperature to about 35°–40° C. After about 3 hours, when the exotherm has subsided, or when the isocyanate content has reached a level of 2.9 milliequivalents per gram, a solution of dimethylol propionic acid and Chain Extender B dissolved in DMF and MIBK was added, followed by the addition of the stabilizers Geltrol, MEHQ and BHT. The exotherm increased the reaction temperature to about 40° C. The reaction mixture was allowed to proceed for about 24 hours. Then, hydroxyethyl methacrylate was added along with the catalyst dibutyl tin dilaurate. The mixture was heated at 60° C. until there was no isocyanate peak at about 2265 cm$^{-1}$ in the IR spectrum. (See Example 15 for formulation).

EXAMPLE 7

Preparation of an Acid-Containing Polyurethane-Acrylate Following Route 3

The reactants used in the synthesis are as follows:

| Materials | Source | Trade Name or Abbreviation | Mole Ratio | Weight (grams) |
|---|---|---|---|---|
| TDI | Mobay | Mondur TD80 | 8 | 50.0 |
| PWB-1200 | Union Carbide | Ucarmod | 2 | 79.7 |
| 1,4-Butanediol | Aldrich | BDO | 2 | 6.5 |
| Chain Extender B | Example 4 | | 2 | 24.8 |
| Dimethylolpropionic acid | Aldrich | DMPA | 1 | 4.8 |
| Hydroxyethyl methacrylate | Rohm and Haas | Rocryl 400 | 2 | 9.3 |
| 4-Methoxyphenol | Aldrich | MEHQ | | 0.41 |
| Geltrol | B F Goodrich | Good-Rite A.O. 3113 | | 0.35 |
| 2,6-Di-t-Butyl-4-Methylphenol | Aldrich | BHT | | 0.38 |
| Methyl Isobutyl Ketone | Aldrich | MIBK | | 20 |
| N,N-Dimethyl Formamide | Aldrich | DMF | | 45 |
| Stannous Octoate | Air Products | DABCO T-9 | | 0.05 |

TDI was charged to a resin kettle equipped with a mechanical stirrer, a thermometer, a nitrogen inlet and an addition funnel. The polyether polyol Ucarmod PWB-1200 was introduced into the reaction vessel under vigorous stirring. The exotherm raised the temperature to about 35°–40° C. After about 3 hours, when the exotherm has subsided, or when the isocyanate content has reached a level of 3.3 milliequivalents per gram, a solution of Chain extender B, MEHQ, Geltrol and BHT in 20 grams DMF and 5 grams MIBK was added. After about one hour under vigorous stirring, at which point, the isocyanate level was closed to 1.6 milliequivalents per gram, a solution of BDO and DMPA in 25 grams DMF and 15 grams MIBK was added. The reaction mixture was allowed to proceed for another 2 hours after which stannous octoate catalyst was added. The mixture was allowed to react for about 18 hours and then hydroxyethylmethacrylate was added. Then the reaction was heated to 60° C. until the IR spectrum did not show any isocyanate peak at about 2260 cm$^{-1}$. The resulting product is an amber, viscous liquid. (See Example 16 for formulation)

EXAMPLE 8

Preparation of an Acid-Containing Polyurethane-Acrylate Following Route 4 (No Hydroxyalkyl(meth)acrylate Terminal Groups)

The reactants used in the synthesis are as follows:

| Materials | Source | Trade Name or Abbreviation | Mole Ratio | Weight (grams) |
|---|---|---|---|---|
| TDI | Mobay | Mondur TD80 | 7 | 50.0 |
| PWB-1200 | Union | Ucarmod | 2 | 91.1 |

| Materials | Source | Trade Name or Abbreviation | Mole Ratio | Weight (grams) |
|---|---|---|---|---|
| Chain Extender A | Carbide Example 4 | — | 3 | 53.0 |
| Dimethylol-propionic acid | Aldrich | DMPA | 3 | 16.5 |
| 4-Methoxyphenol | Aldrich | MEHQ | | 0.34 |
| Geltrol | B F Goodrich | Good-Rite A.O. 3113 | | 0.34 |
| 2,6-Di-t-Butyl-4-Methylphenol | Aldrich | BHT | | 0.34 |
| Methyl Isobutyl Ketone | Aldrich | MIBK | | 92.5 |
| N,N-Dimethyl Formamide | Aldrich | DMF | | 87.5 |
| Dibutyl Tin Dilaurate | Air Products | Dabco T-12 | | 0.075 |

TDI was charged to a resin kettle equipped with a mechanical stirrer, a thermometer, a nitrogen inlet and an addition funnel. The polyether polyol Ucarmod PWB-1200 was introduced in the reaction vessel under vigorous stirring. The exotherm raised the temperature to about 35°–40° C. After about 3 hours, when the exotherm has subsided, or when the isocyanate content has reached a level of 2.9 milliequivalents per gram, a solution of dimethylol propionic acid and Chain Extender A dissolved in DMF and MIBK was added, followed by the addition of the stabilizers Geltrol, MEHQ and BHT. The reaction mixture was then heated to 50°·C. in the presence of the catalyst T-12 unit the IR spectrum showed the complete disappearance of the isocyanate peak at about 2265 cm$^{-1}$. (See Example 17 for formulation).

EXAMPLE 9

Preparation of an Acid-Containing Polyurethane-Acrylate

The reactants used in the synthesis are shown below:

| Materials | Source | Trade Name or Abbreviation | Mole Ratio | Weight (grams) |
|---|---|---|---|---|
| TDI | Mobay | Mondur TD80 | 7 | 50.0 |
| PWB-1200 | Union Carbide | Ucarmod | 2 | 91.1 |
| Chain Extender A | Example 3 | — | 2 | 35.9 |
| Dimethylol-propionic acid | Aldrich | DMPA | 2 | 11.0 |
| Hydroxyethyl methacrylate | Rohm and Haas | Rocryl 400 | 2 | 10.6 |
| 4-Methoxyphenol | Aldrich | MEHQ | | 0.34 |
| Geltrol | B F Goodrich | Good-Rite A.O. 3113 | | 0.34 |
| 2,6-Di-t-Butyl-4-Methylphenol | Aldrich | BHT | | 0.34 |
| Methyl Isobutyl Ketone | Aldrich | MIBK | | 50 |
| N,N-Dimethyl Formamide | Aldrich | DMF | | 62 |
| Toluene | Aldrich | — | | 10 |

TDI, MEHQ and BHT were charged to a resin kettle equipped with a mechanical stirrer, a thermometer, and a nitrogen inlet. Chain Extender A was then added to TDI under vigorous stirring. The exotherm raised the reaction temperature to about 27° C. The mixture was allowed to react for about 3 hours, until the isocyanate content (as determined by titration with dibutylamine) was about 4.7 milliequivalents/gram. The polyether polyol Ucarmod PWB-1200 was added and the reaction was allowed to proceed for about 5 hours until the isocyanate content reached a level of about 1.37 milliequivalents/gram. (The exothermic reaction brought the reaction temperature to about 40° C.). Then a solution of dimethylol propionic acid and Geltrol in DMF, MIBK and toluene was added. The mixture was allowed to react until the isocyanate content reached a level of about 0.38 milliequivalents/gram. Finally, hydroxyethylmethacrylate was added and the reaction heated to 50° C. until completion when the IR spectrum showed the complete disappearance of the isocyanate peak at about 2265 cm$^{-1}$. (See Example 18 for formulation).

Referring to Example 9, it will be noted that the first reaction involves reacting dihydroxy dimethacrylate (DHDMA) with an excess of toluene diisocyanate (TDI). Generically, the resulting prepolymer may be represented schematically as diisocyanate-methacrylate, the two components being joined by urethane linkages, —NHC(:O)—O—; and the diisocyanate and methacrylate having the structures given below.

Generically speaking, in making a prepolymer of this type, any diisocyanate (NCO—R$^2$—NCO, where R$^2$ is a divalent organic moiety as above described) can be used. Also, in lieu of DHDMA, a methacrylate of the following generic structure can be used:

HOC(E)HCH$_2$OC(:O)—(CH$_2$)$_n$C(:O)—O—CH$_2$C-H(E')—OH where
E is CH=C(CH$_3$)C(:O)—O—CH$_2$—;
E' is H or E; and
n is 3–0.

More precisely, the resulting generic prepolymer (using excess diisocyanate) may be expressed as

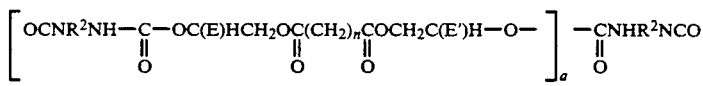

where a indicates repeating segments of the bracketed moiety. The aggregate prepolymer is considered to be a mixture of prepolymer molecules of varying length (i.e., where a varies).

When the acrylate reactant is in excess, the prepolymer will have the structure

[G—C(:O)NH—R$^2$NHC(:O)—]$_a$G where G is HOC(E)HCH$_2$OC(:O)—CH$_2$)$_n$(:O)'CH$_2$-C(E')H—O—; R$^2$ and n are as defined above, and a (as in the preceding description) indicates varying prepolymer molecular weights.

Within the above generic structures, and using the same process of Example 9, various species can be made, e.g., the TDI-DHDMA-TDI product of Example 9 (TDI in excess); DHDMA-TDI-DHDMA, using the Example 9 process except with DHDMA in stoichiometric excess. In each of the said two instances, the components are linked via urethane linkages, —NHC(:O)—O—. Other methacrylate-diisocyanate products can be made by the same processes.

Thus, in a general sense, an important embodiment of the invention includes chain extending substantially any urethane by reacting it with a dihydroxydimethacrylate of the general structure:

HOC(E)HCH$_2$OC(:O)—(CH$_2$)$_n$—C(:O)—O—CH$_2$-C(E)H—OH where $n=3-10$ and E is $CH_2$=$CH(CH_3$—$C(:O)$—$O$—$CH_2$—.

EXAMPLE 10

Preparation of an Acid-Containing Polyurethane-Acrylate from a Non-Acid Grafted (i.e. Conventional) Polyether Diol The reactants used in the synthesis are shown below:

| Materials | Source | Trade Name or Abbreviation | Mole Ratio | Weight (grams) |
|---|---|---|---|---|
| TDI | Mobay | Mondur TD80 | 7 | 50.0 |
| PPG-1025 | Union Carbide | Niax Polyether diol | 2 | 82.1 |
| 1,4-Butanediol | Aldrich | BDO | 0.25 | 0.9 |
| Dimethylolpropionic acid | Aldrich | DMPA | 3.75 | 20.9 |
| Hydroxyethyl methacrylate | Rohm and Haas | Rocryl 400 | 2 | 10.6 |
| Geltrol | B F Goodrich | Good-Rite A.O. 3113 | | 0.7 |
| 2,6-Di-t-Butyl-4-Methylphenol | Aldrich | BHT | | 0.35 |
| Methyl Isobutyl Ketone | Aldrich | MIBK | | 40 |
| N,N-Dimethyl Formamide | Aldrich | DMF | | 80 |
| Toluene | Aldrich | — | | 45 |
| Dibutyltin Dilaurate | Air Products | Dabco T-12 | | 0.07 |

TDI and Dabco T-12 were charged to a resin kettle equipped with a mechanical stirrer, a thermometer, a nitrogen inlet and an addition funnel. The polyether diol PPG-1025 was then introduced into the reaction vessel under vigorous stirring. The exotherm raised the temperature to about 35°–40° C. After about 4 hours, when the exotherm has subsided, or when the isocyanate content has reached a level of about 3.1 milliequivalents per gram, a solution of dimethylol propionic acid and BDO dissolved in DMF, MIBK and Toluene was added, followed by the addition of Geltrol and BHT. The reaction mixture was then heated to 60° C. for about 4 hours and hydroxyethyl methacrylate was added. The reaction was allowed to react at 60° C. until the IR spectrum showed no isocyanate peak. (See Example 19 for formulation).

EXAMPLE 11

Preparation of an Acid-Containing Polyurethane-Acrylate from a Mixture of Base Polymers: Acid-Grafted and Non-Acid Grafted (i.e. Conventional) Polyether Diols The reactants used in the synthesis are shown below:

| Materials | Source | Trade Name or Abbreviation | Mole Ratio | Weight (grams) |
|---|---|---|---|---|
| TDI | Mobay | Mondur TD80 | 7 | 50.0 |
| PWB-1200 | Union Carbide | Ucarmod | 1.5 | 68.3 |
| PPG-1025 | Union Carbide | Niax Polyether diol | 1 | 41.0 |
| Chain Extender A | Example 3 | — | 2 | 35.3 |
| Dimethylolpropionic acid | Aldrich | DMPA | 3 | 16.5 |
| 4-Methoxyphenol | Aldrich | MEHQ | | 0.34 |
| Geltrol | B F Goodrich | Good-Rite A.O. 3113 | | 0.34 |
| 2,6-Di-t-Butyl-4-Methylphenol | Aldrich | BHT | | 0.34 |
| Methyl Isobutyl Ketone | Aldrich | MIBK | | 80 |
| N,N-Dimethyl Formamide | Aldrich | DMF | | 70 |
| Stannous Octoate | Air Products | Dabco T-12 | | 0.07 |

TDI was charged to a resin kettle equipped with a mechanical stirrer, a thermometer, a nitrogen inlet and an addition funnel. The polyether polyol Ucarmod PWB-1200 was mixed with the polyether diol PPG-1025 and then introduced in the reaction vessel under vigorous stirring. The exotherm raised the temperature to about 35°–40° C. After about 3 hours, when the exotherm has subsided, or when the isocyanate content has reached a level of 2.3 milliequivalents per gram, a solution of the stabilizers in 10 grams MIBK was added. Then a solution of dimethylol propionic acid and Chain Extender A dissolved in DMF and MIBK was added. Then the reaction mixture was heated to 50° C. in the presence of the catalyst T-9 until the IR spectrum showed the complete disappearance of the isocyanate peak at about 2265 cm$^{-1}$. (See Example 20 for formulation).

EXAMPLES 12–20

Formulations of the Acid-Containing Polyurethane-Acrylate Photopolymers Prepared in Examples 1, 2, 5–11 and Preparation of the Final Printing Plates Photocurable compositions are formulated by mixing the components in the proportions as described below:

| | EXAMPLES | | | | | | | | |
|---|---|---|---|---|---|---|---|---|---|
| | 12 | 13 | 14 | 15 | 16 | 17 | 18 | 19 | 20 |
| | | | | WEIGHT (grams) | | | | | |
| Reaction Mixture of | | | | | | | | | |
| Example 1 | 100 | — | — | — | — | — | — | — | — |
| Example 2 | — | 130 | — | — | — | — | — | — | — |
| Example 5 | — | — | 100 | — | — | — | — | — | — |

-continued

| | EXAMPLES | | | | | | | | |
|---|---|---|---|---|---|---|---|---|---|
| | 12 | 13 | 14 | 15 | 16 | 17 | 18 | 19 | 20 |
| | WEIGHT (grams) | | | | | | | | |
| Example 6 | — | — | — | 100 | — | — | — | — | — |
| Example 7 | — | — | — | — | 80 | — | — | — | — |
| Example 8 | — | — | — | — | — | 100 | — | — | — |
| Example 9 | — | — | — | — | — | — | 100 | — | — |
| Example 10 | — | — | — | — | — | — | — | 100 | — |
| Example 11 | — | — | — | — | — | — | — | — | 100 |
| Diluents[1] | | | | | | | | | |
| Sartomer CN 971 | 9.2 | 11.4 | 9.2 | 9.0 | 11.7 | — | — | 15 | — |
| TMOPTMA | 3.0 | — | — | — | — | — | — | — | — |
| Ebecryl 6700 | — | — | — | — | — | — | 12.4 | — | — |
| Sartomer CN 972 | — | — | — | — | — | — | 6.5 | — | — |
| PPGMMA | — | — | — | — | — | — | — | — | 8.8 |
| Irgacure 651 | 0.7 | 0.7 | 0.6 | 0.6 | 0.7 | 0.6 | 0.7 | 1.0 | 0.5 |
| Toluene | — | — | 6 | 6 | 10 | — | — | — | — |
| 2-Propanol | 20 | 10 | 6 | 6 | 10 | — | 10 | — | — |
| Potassium Hydroxide Solution (20 wt % in Methanol) | 1.5 | 6 | — | — | — | — | — | — | — |
| WASH RATE | 3.4 | 8.5 | 12.5 | 12.5 | 3 | 11.6 | 14.5 | 10 | 10 |
| PERCENT SWELL IN:[2] | | | | | | | | | |
| WATER | — | — | 3 | 5 | 4 | 6 | 5 | 6 | 6 |
| AQUEOUS-BASED INK | 120 | 106 | 24 | 15 | 10 | 73 | 24 | 99 | 62 |

[1]Sartomer CN 971 is an aromatic acrylate avaiable from Sartomer Co.
TMOPTMA is trimethylolpropane trimethacrylate (Sartomer 350 for Sartomer Co.)
Ebecryl 6700 is an aromatic urethane acrylate from Radcure Specialties Co.
[2]Swell tests were done on 0.5 in. × 0.5 in. × 20 mils thick films soaked in the solvent for 24 hours at ambient temperature.

The difference in swell rates in Examples 14 and 15 is considered due to minor variations in the respective reaction products in dihydroxydimethacrylate.

The above formulations of Examples 12–20 were solvent cast onto metal or polyester support and then dried to remove the solvent. The resulting solid, non-tacky photopolymer plates were then imaged by exposure through a negative and developed in a 1 percent sodium carbonate aqueous solution at 150° F. to give a good relief and sharp image at washout rates of 3–13 mils per minute. Films prepared from the dihydroxydimethacrylate chain extenders (Examples 15–16) also showed good swell resistance in both water and aqueous-based ink which are suitable for printing. It can be seen that the ink resistance of the polymers can be controlled by adjusting the molar ratio of the diisocyanate and the dihydroxydimethacrylate chain extender. Ink swell can be adjusted by controlling the amount of dihydroxydimethacrylate chain extender in the polymer.

The invention thus includes:
(i) Precursor for a photopolymer, and the photopolymer, viz:

Composition comprising a compound of the structure

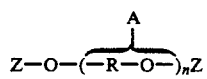

where
R is independently ethylene, propylene, isopropylene, butylene, isobutylene, or mixtures thereof;
n is such that the molecular weight of the (—R—O—) chain varies from 500 to about 10,000;
A is H or $R^1$
$R^1$ is —CH$_2$CH$_2$COOH, —CH$_2$CH(CH$_3$)COOH, or —CH(COOH)—CH$_2$COOH, the average number of $R^1$ units being such that they constitute 1–30 weight percent of the total molecular weight of the (—R—O—) chain;

Z comprises chain extending segments of (-II-IV-) and (-II-IV'-) and is terminated by (-II), (-II-VI), (-II-IV), or (-II-IV'); components of said segments being joined by urethane linkages, —NH—C(:O)—O—;
II is a diisocyanate;
IV is a diol containing —COOH and having a molecular weight less than 500;
IV' is a carboxyl-free diol having a molecular weight less than 500 or a (meth)acrylate(s)-containing diol; and
VI is hydroxyalkyl(meth)acrylate.

Compounds terminating in VI are photopolymers (herein, VII). Compounds containing segments comprising dihydroxydi(meth)acrylate(s) are also photopolymers (herein, VIII), whether or not terminating in VI. Thus, a photopolymer VIII can be further treated with VI and thereby converted into photopolymer VII. Compounds terminating in II can be precursors for making VIII and/or VII.

(ii) Methods for making the aforesaid photopolymers and precursors.
(iii) Formulations with the photopolymers. (Both types take the same kinds of formulations.)
(iv) Printing plates with a layer of photopolymer formulation (developed and undeveloped).
(v) Methods of making the plates.
(vi) Methods of exposing and developing the plates.

What is claimed:
1. Composition comprising compounds of the structure

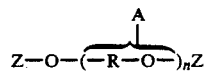

where
R is independently ethylene, propylene, isopropylene, butylene, isobutylene, or mixtures thereof;

n is such that the molecular weight of the (—R—O—) chain varies from 500 to about 10,000;

A is a mixture of H and $R^1$ $R^1$ is —CH$_2$CH$_2$COOH, —CH$_2$CH(CH$_3$)COOH, or —CH(COOH)—CH$_2$COOH, the average number of $R^1$ units being such that they constitute 1-30 weight percent of the total molecular weight of the (—R—O—) chain;

Z comprises chain extending segments of (-II-IV-) and (-II-IV'-) and terminating segments of (-II-VI), (-II-IV), or (-II-IV'); the segments being the reaction products of a diisocyanate and a diol or a hydroxyalkyl(meth)acrylate wherein an isocyanate group and a hydroxyl group form a carbamate group, whereby the components of the segments are joined by urethane linkages, —NH—C(:O)—O—; where II is a diisocyanate;

IV is a diol containing —COOH and having a molecular weight less than 500;

IV' is a (meth)acrylate(s)-containing diol or a mixture of a (meth)acrylate(s) containing diol and a carboxyl-free diol having a molecular weight less than 500; and VI is hydroxyalkyl(meth)acrylate.

2. Composition according to claim 1 where IV is dimethylolpropionic acid and IV' is a mixture of a (meth)acrylate(s)-containing diol and 1,4 butane diol.

3. Composition according to claim 1 wherein IV is dimethylolpropionic acid and IV' is a mixture of dihydroxydimethacrylate and a carboxyl-free diol having a molecular weight less than 500.

4. Composition according to claim 1 wherein IV is dimethylolpropionic acid and IV' is dihydroxydimethacrylate.

5. Composition according to claim 4, further comprising a photoinitiator and about 1-30 weight % photoactive (meth)acrylate monomers or oligomers.

6. Composition according to claim 5, comprising about 5-20 weight % photoactive (meth)acrylate monomers or oligomers.

7. Composition according to claim 1 where
R is isopropylene;
$R^1$ is —CH$_2$CH$_2$COOH;
II is 4,4'-methylene diphenyl diisocyanate or tolylene diisocyanate;
IV is a dimethylolpropionic acid;
IV' is a mixture of 1,4-butane diol and dihydroxydimethacrylate.

8. Composition according to claim 1 where Z is terminated by (-II-VI).

9. Composition according to claim 8 wherein IV' is dihydroxydimethacrylate.

10. Composition according to claim 8 wherein
R is isopropylene;
n is such that the molecular weight of the (—R—O—) chain is about 1000;
$R^1$ is —CH$_2$CH$_2$COOH;
IV' is a mixture of dihydroxydimethacrylate and a carboxy-free diol having a molecular weight less than 500; and
II is 4,4'-methylene diphenyl diisocyanate or tolylene diisocyanate;
VI is hydroxyethylmethacrylate.

11. Composition according to claim 10 wherein IV is dimethylolpropionic acid and IV' is a mixture of dihydroxydimethacrylate and 1,4 butane diol.

12. Composition consisting essentially of, in parts by weight:
(1) Composition of claim 1, being a photopolymer, about 10-100;
(2) Aromatic or aliphatic urethane acrylate, about 5-30;
(3) Trimethylolpropane trimethacrylate or any acrylate diluent, about 0-20;
(4) Photoinitiator, about 0.1-10;
(5) Organic solvent, about 0-200;
(6) Potassium hydroxide solution (20 wt % in methanol), about 0-20.

13. Composition according to claim 12 wherein
in (1) the photopolymer composition is about 70-90;
in (2) acrylate is about 10-20;
in (3) trimethylolpropane trimethacrylate is about 5-10;
in (4) photoinitiator is about 0.5-10;
in (5) organic solvent is about 10-40; and
in (6) potassium hydroxide solution is about 5-20.

* * * * *

UNITED STATES PATENT AND TRADEMARK OFFICE
CERTIFICATE OF CORRECTION

PATENT NO. : 5,290,663
DATED : March 1, 1994
INVENTOR(S) : Huynh-Tran

It is certified that error appears in the above-indentified patent and that said Letters Patent is hereby corrected as shown below:

Column 32, Claim 10, line 10, after "claim 8" insert
--consisting essentially of compounds--

Signed and Sealed this

Twenty-ninth Day of November, 1994

Attest:

BRUCE LEHMAN

Attesting Officer          Commissioner of Patents and Trademarks